(12) United States Patent
Bailey et al.

(10) Patent No.: US 7,684,201 B2
(45) Date of Patent: Mar. 23, 2010

(54) MULTI-STAGE ALIGNMENT GUIDEPIN

(75) Inventors: Mark M. Bailey, Burnet, TX (US); Lawrence A. Kyle, Salado, TX (US)

(73) Assignee: Dell Products, LP, Round Rock, TX (US)

( * ) Notice: Subject to any disclaimer, the term of this patent is extended or adjusted under 35 U.S.C. 154(b) by 171 days.

(21) Appl. No.: 11/757,172

(22) Filed: Jun. 1, 2007

(65) Prior Publication Data
US 2008/0298004 A1    Dec. 4, 2008

(51) Int. Cl.
H05K 1/14    (2006.01)
(52) U.S. Cl. ....................... 361/741; 439/378
(58) Field of Classification Search ........... 361/741, 361/725, 802, 683; 439/378, 160, 248
See application file for complete search history.

(56) References Cited

U.S. PATENT DOCUMENTS

| | | | | |
|---|---|---|---|---|
| 3,951,500 A * | 4/1976 | Anderson | ................... | 439/248 |
| 4,776,811 A | 10/1988 | Humphrey | | |
| 4,980,800 A * | 12/1990 | Furuta | ................... | 361/727 |
| 5,552,959 A * | 9/1996 | Penniman et al. | ...... | 361/679.41 |
| 5,641,299 A * | 6/1997 | Meguro et al. | ............. | 439/347 |
| 5,652,695 A | 7/1997 | Schmitt | | |
| 5,690,504 A * | 11/1997 | Scanlan et al. | ............. | 439/378 |
| 5,761,045 A * | 6/1998 | Olson et al. | ................. | 361/726 |
| 5,795,177 A * | 8/1998 | Hirono | ........................ | 439/378 |
| 6,059,600 A | 5/2000 | Vanbesien | | |
| 6,358,075 B1 * | 3/2002 | Tischner | ..................... | 439/248 |
| 6,424,527 B1 | 7/2002 | Bailey et al. | | |
| 6,527,572 B2 * | 3/2003 | Jou | ........................... | 439/248 |
| 6,535,397 B2 * | 3/2003 | Clark et al. | .................. | 361/788 |
| 6,556,440 B2 | 4/2003 | Jensen et al. | | |
| 6,592,387 B2 * | 7/2003 | Komenda et al. | ........... | 439/247 |
| 6,822,863 B1 | 11/2004 | Artman et al. | | |
| 6,986,671 B2 * | 1/2006 | Margulis et al. | .............. | 439/78 |
| 7,241,149 B2 * | 7/2007 | Abadia | ........................ | 439/75 |
| 7,285,005 B2 * | 10/2007 | Gabrielsson et al. | ........ | 439/378 |
| 7,419,394 B2 * | 9/2008 | Jensen et al. | ................. | 439/248 |
| 2004/0087202 A1 * | 5/2004 | Baccei et al. | ................ | 439/378 |
| 2005/0124226 A1 | 6/2005 | Ahmed et al. | | |
| 2006/0012953 A1 | 1/2006 | Mills et al. | | |
| 2006/0203435 A1 | 9/2006 | Kyle et al. | | |
| 2006/0203447 A1 | 9/2006 | Kyle et al. | | |

* cited by examiner

*Primary Examiner*—Hae Moon Hyeon
(74) *Attorney, Agent, or Firm*—Larson Newman & Abel, LLP

(57) ABSTRACT

An alignment guidepin comprises a pre-alignment portion, an alignment portion, and a release portion. The pre-alignment portion provides gross alignment for a connection between a connecting module of a server and a connector of a computer server chassis. The alignment portion is connected to the pre-alignment portion having a first diameter to allow a high precision alignment for the connection between the connecting module and the connector. The release portion is connected to the alignment portion having a second diameter different than the first diameter to allow the connecting module and the connector to guide the connection.

20 Claims, 9 Drawing Sheets

MULTI-STAGE ALIGNMENT GUIDEPIN

FIELD OF THE DISCLOSURE

This disclosure generally relates to connectors for computer servers, and more particularly relates to a guidepin for a server connector.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Computer systems often utilize a number of servers mounted in racks. Proper insertion of these devices into their respective racks requires physical and electrical connections between the device and the system. However, an individual inserting the device is often required to apply force directly to the server, either through pushing or pulling, to connect male and female connectors. Further, in an attempt to insert or remove a device from the system, the individual often applies force to the device in a direction non-parallel to the connector. Connector pins are often bent by the application of such forces.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application.

Figure 1:
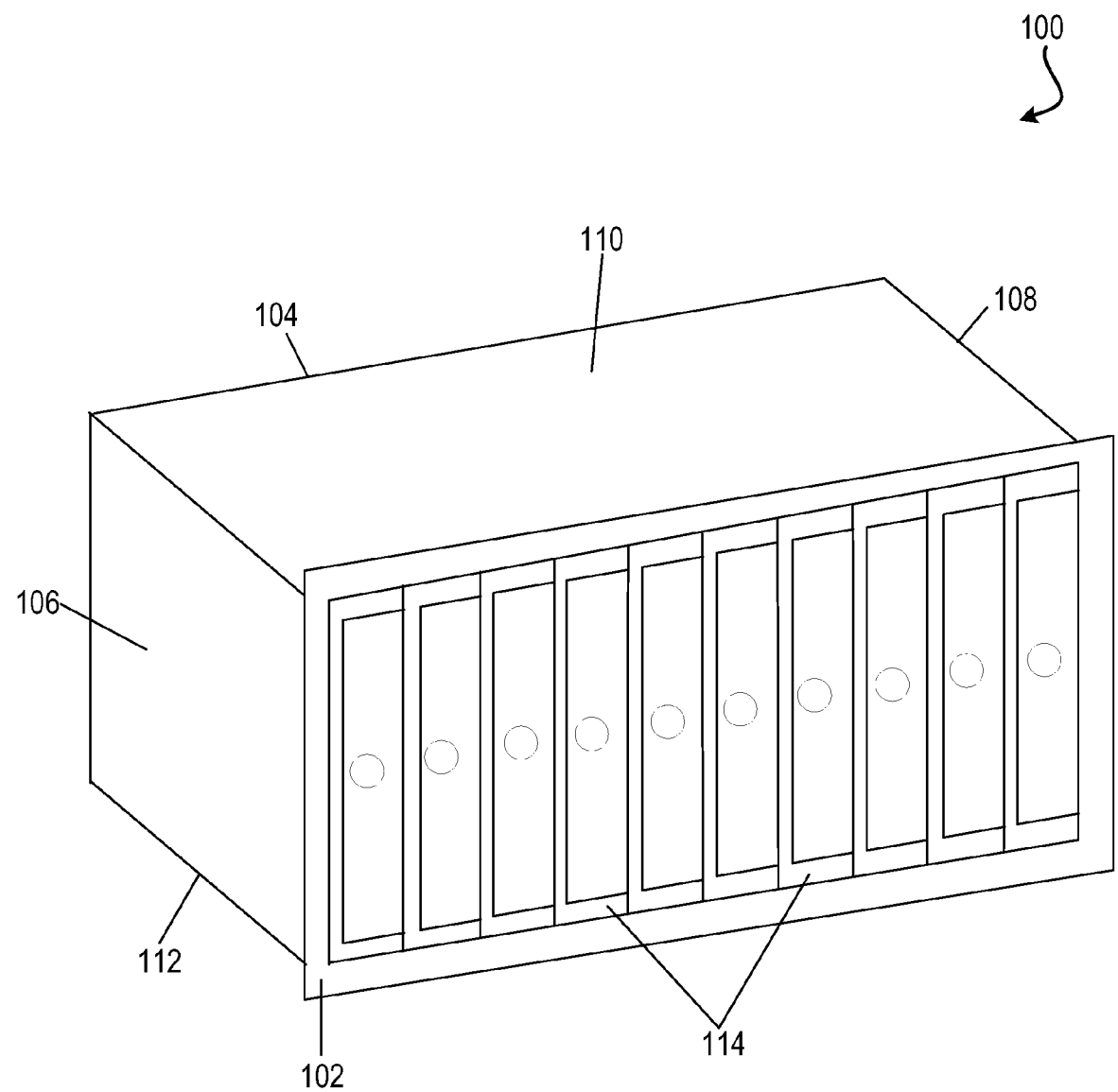
FIG. 1 is a perspective view of a computer server chassis.
Figure 2:
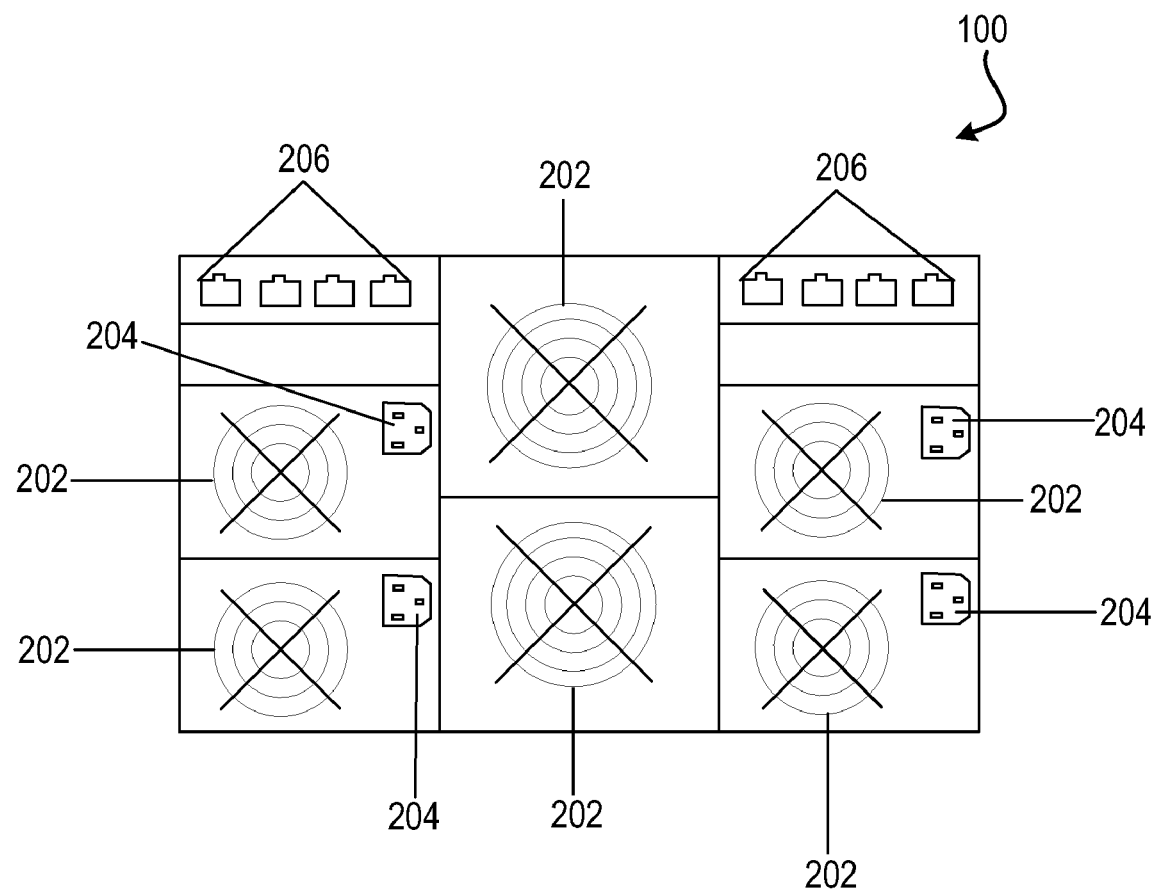
FIG. 2 is a rear view of the computer server chassis.

FIG. 1 shows a computer server chassis 100 including a front panel 102, a back panel 104, a left panel 106, a right panel 108, a top panel 110, and a bottom panel 112. The computer server chassis 100 is adapted to accept a plurality of servers, such as blade servers 114. The computer server chassis 100 may be installed in a server chassis rack (not shown) such that the servers 114 are connected to each other and/or other servers to form a network. The servers 114 in turn perform a variety of tasks, such as running software applications and storing and accessing data, as is well known. FIG. 2 shows the rear of the computer server chassis 100 including a plurality of cooling fans 202, a plurality of power plugs 204, and a plurality of connectors 206. The connectors 206 are preferably IEEE 802.3 plugs adapted to receive Ethernet cables to connect the servers 114 with other servers and computers in the network.

Figure 3:
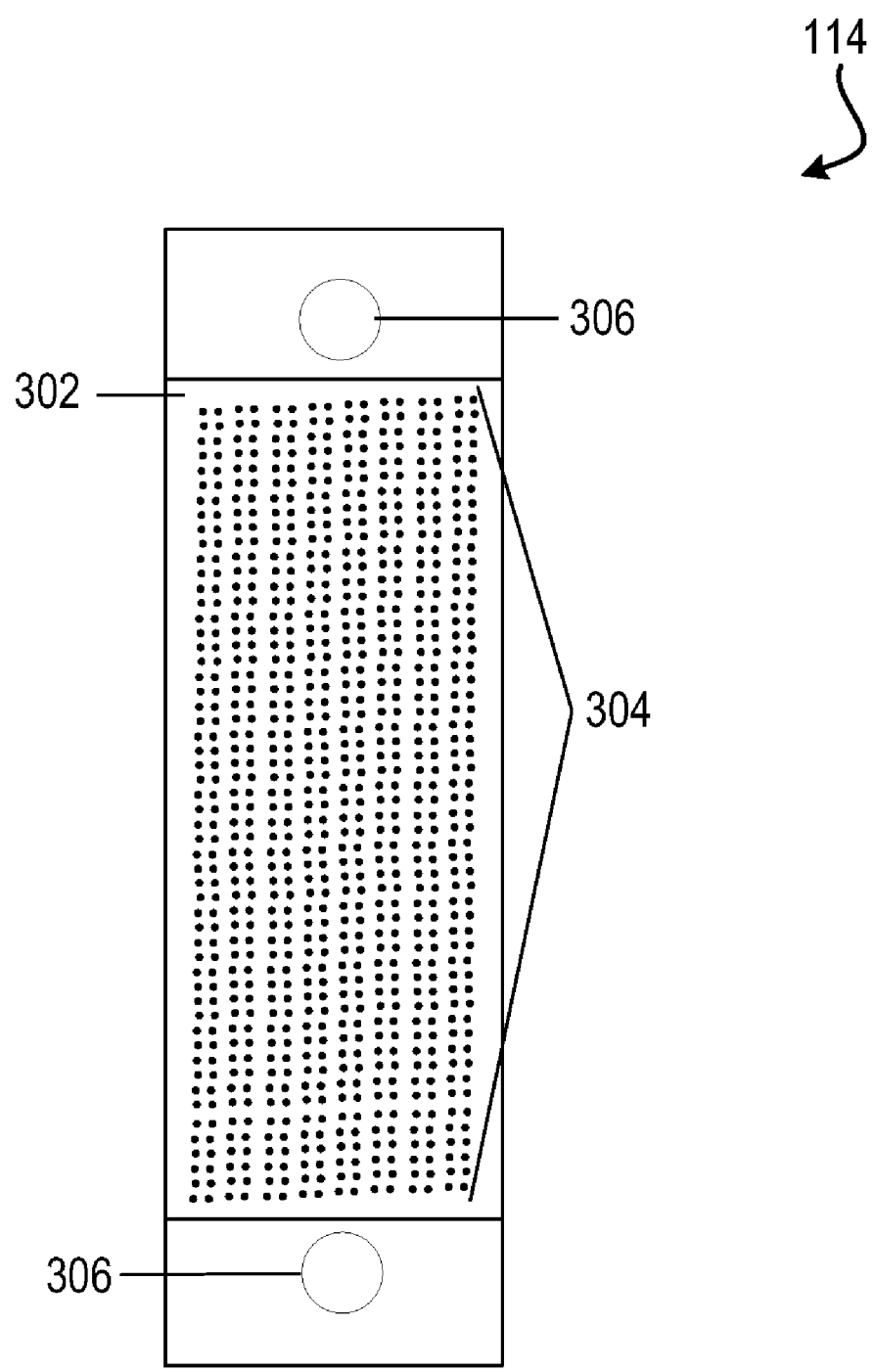
FIG. 3 is a rear view of a server.

FIG. 3 shows the rear of the server 114 including a connecting module 302 that is disposed on the rear of the server 114. A plurality of electrical pins 304 are located inside the connecting module 302, and are adapted to create a high bandwidth connection between the server 114 and the computer server chassis 100. The small size and close proximity of the electrical pins 304 create a low gatherability in the server 114, which is the distance that the server is able to move while maintaining a proper connection with the computer server chassis 100 without causing damage to the server or the computer server chassis. The lower the gatherability, the less the connecting module 302 is able to move without causing damage to the connecting module or the computer server chassis 100. The guidepins 306 are located on the sides of the connecting module 302.

Figure 4:
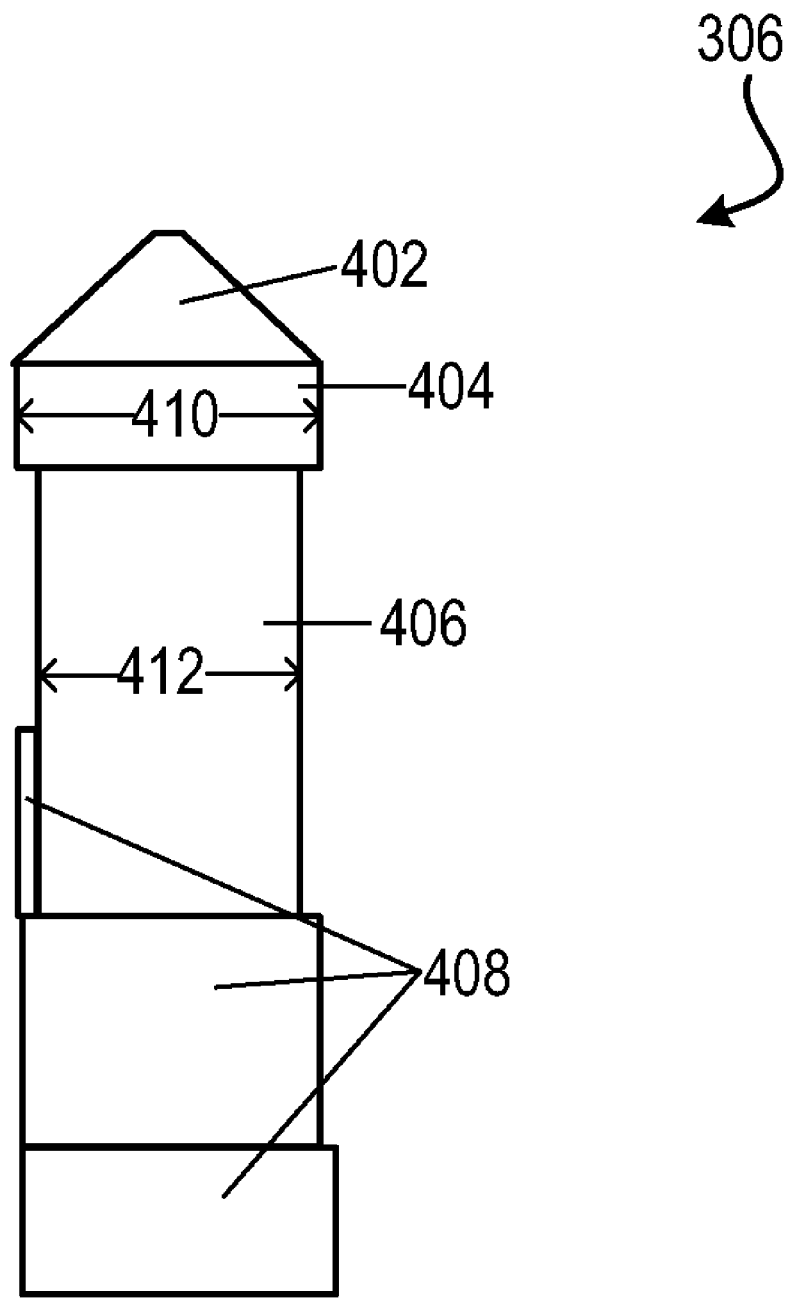
FIG. 4 is a side view of an end of an alignment guidepin.

FIG. 4 shows one of the guidepins 306 including a pre-alignment portion 402, an alignment portion 404, a release portion 406, and a plurality of mounting portions 408. The pre-alignment portion 402 is preferably a tapering cone shape located at the end of the guidepins 306. The alignment portion 404 is connected to the pre-alignment portion 402 and preferably has a cylindrical shape with a constant first diameter 410. The alignment portion 404 is additionally connected to the release portion 406, which is preferably cylindrical having a constant second diameter 412 advantageously less than the first diameter 410. The release portion 406 is connected to the mounting portions 408 and extends out from the server 114. The mounting portions 408 connect the guidepins 306 to the connecting module 302 and thus to the server 114.

Figure 5:
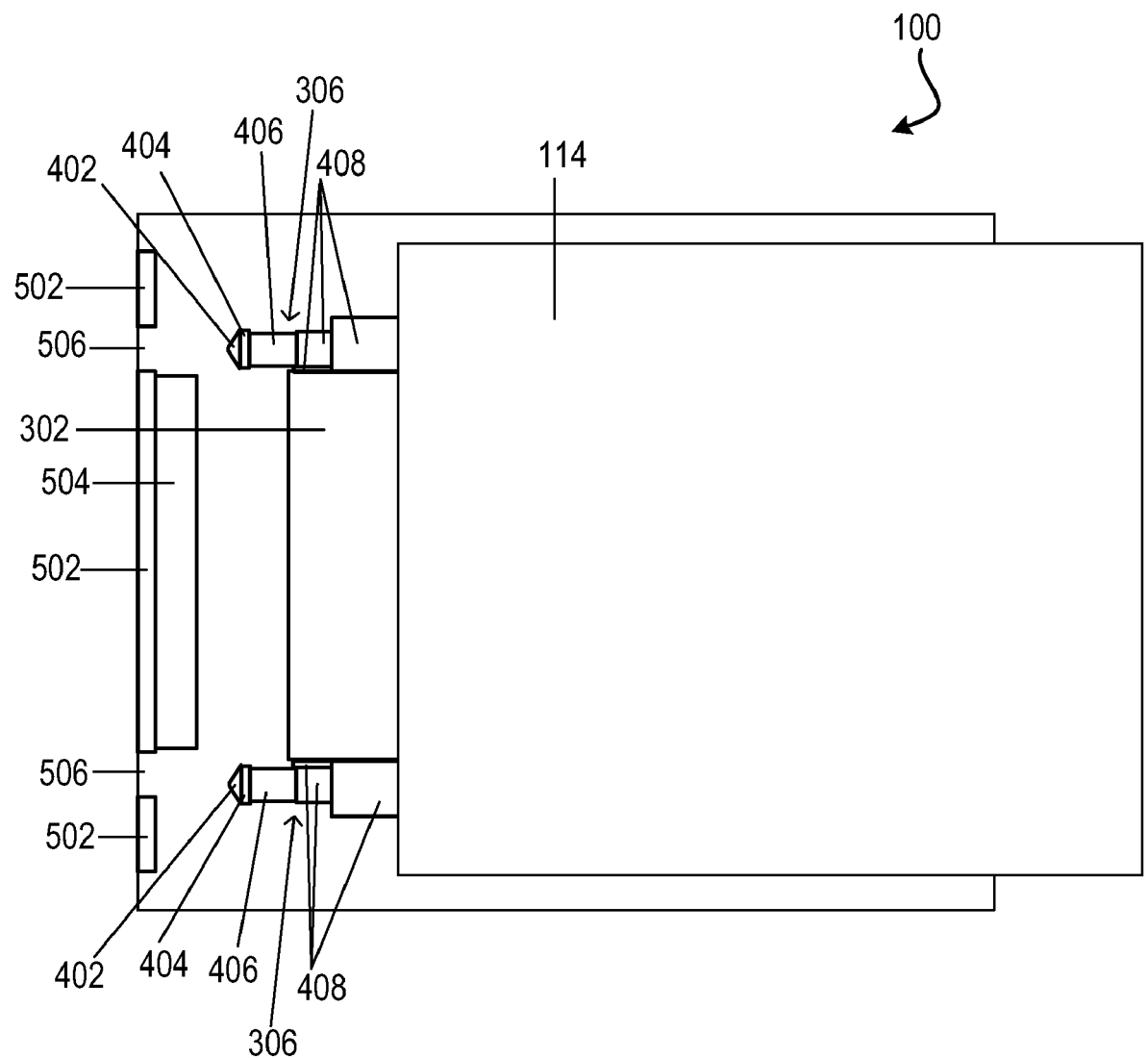
FIG. 5 is a side view of the server inside the computer server chassis in a first pre-connection position.
Figure 6:
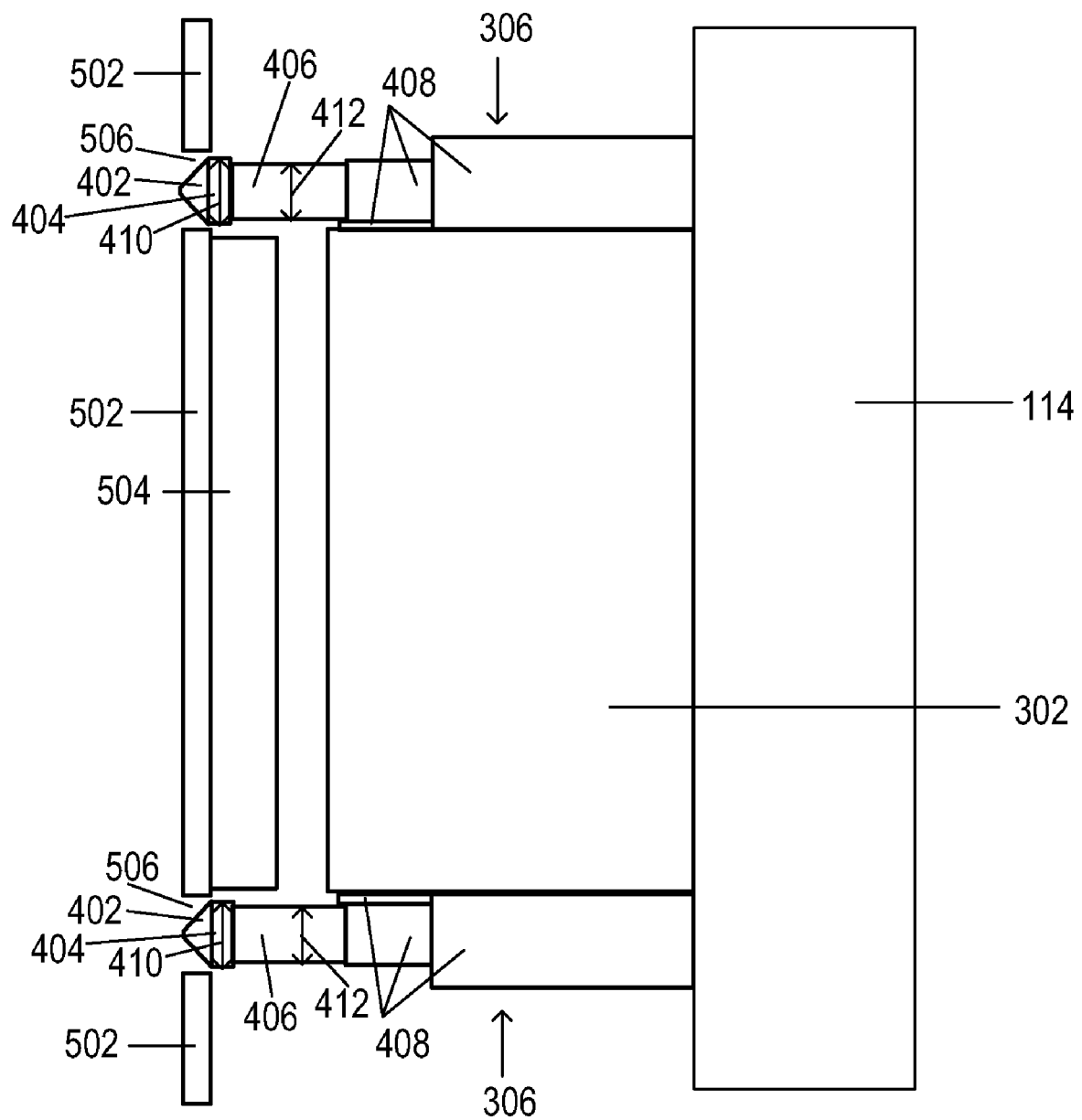
FIG. 6 is an enlarged side view of a portion of the server and the computer server chassis in a second pre-connection position.

FIGS. 5 and 6 show the server 114 inside the computer server chassis 100 prior to their mating. The computer server chassis 100 includes a mounting plate 502 with a plurality of apertures 506 flanking a connector 504. The mounting plate 502 is connected to the back panel of the computer server chassis 100, and the connector 504 is connected to the mounting plate 502. The connection between the server 114 and the mounting plate 502 of the computer server chassis 100 is a blind-mate connection, and therefore an individual plugging the server into the mounting plate cannot see the connection between the connecting module 302 and the connector 504. In the position shown in FIG. 6, the pre-alignment portion 402 of each guidepin 306 enters the apertures 506 to bring the connecting module 302 and the connector 504 into a gross alignment. As the pre-alignment portion 402 is inserted further in the apertures 506, the alignment between the connecting module 302 and the connector 504 continues to improve. Therefore, an individual plugging the server 114 into the mounting plate 502 does need to start with an exact alignment to providing a proper connection, but is guided to the proper alignment by the pre-alignment portion 402.

Figure 7:
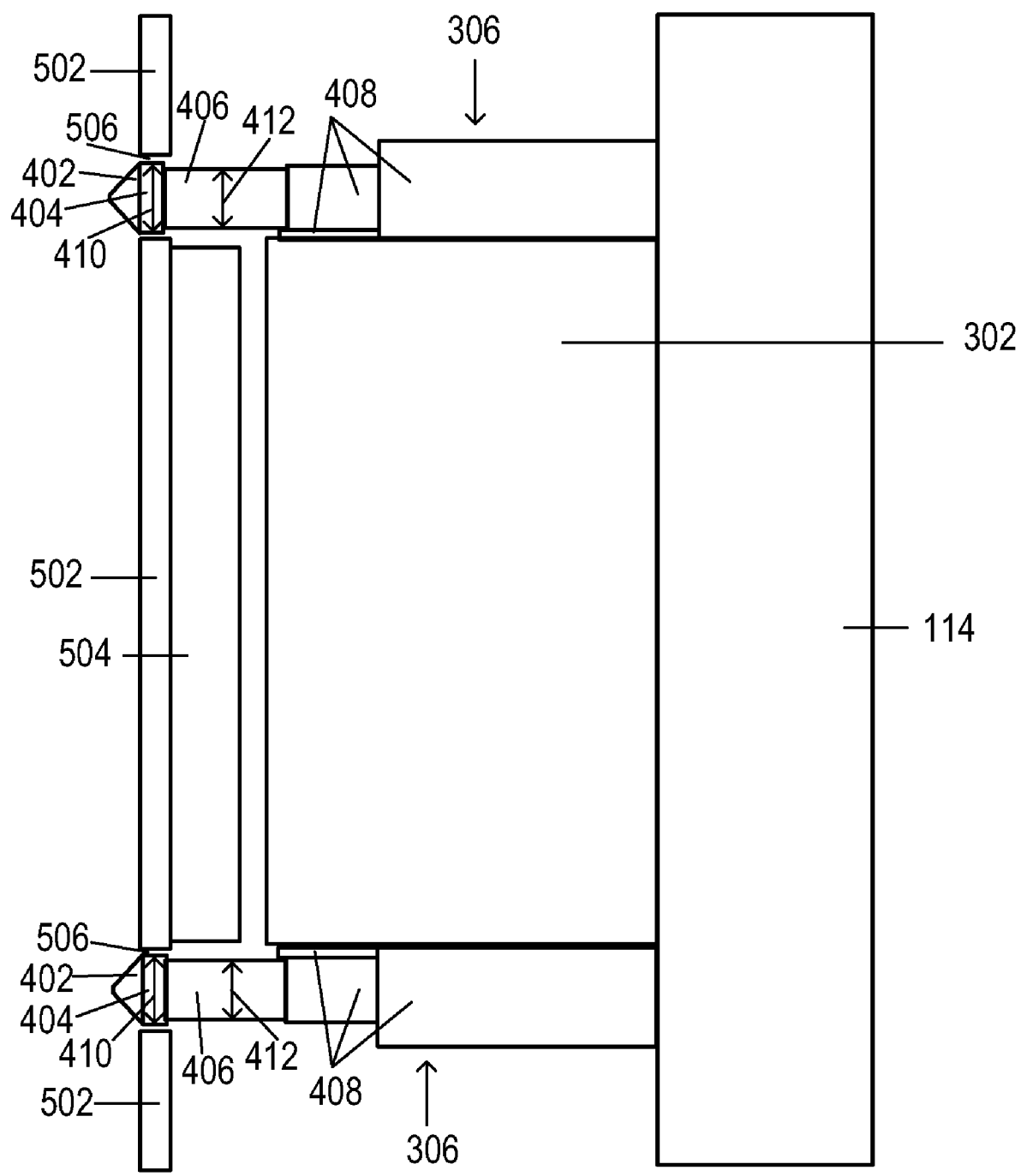
FIG. 7 is an enlarged side view of the portion of the server and the computer server chassis in a third pre-connection position.

FIG. 7 shows the connecting module 302 further inserted. As stated above, the server 114 and the mounting plate 502 have a high bandwidth capacity and a low gatherability. Therefore, the connecting module 302 and the connector 504 are preferably guided by the guidepins 306 with a high precision to avoid binding or damaging the connecting module or the connector. Once the pre-alignment portion 402 has provided gross alignment between the connecting module 302 and the connector 504, the alignment portion 404 of the guidepins 306 comes in contact with the apertures 506 to further guide the connection between the server 114 and the mounting plate 502. The first diameter 410 of the alignment portion 404 creates a tight fit with the apertures 506. The alignment portion 404 fully engages the inside wall of the apertures 506 by contacting the entire inner periphery of the apertures, thereby creating the proper alignment between the connecting module 302 and the connector 504.

Figure 8:
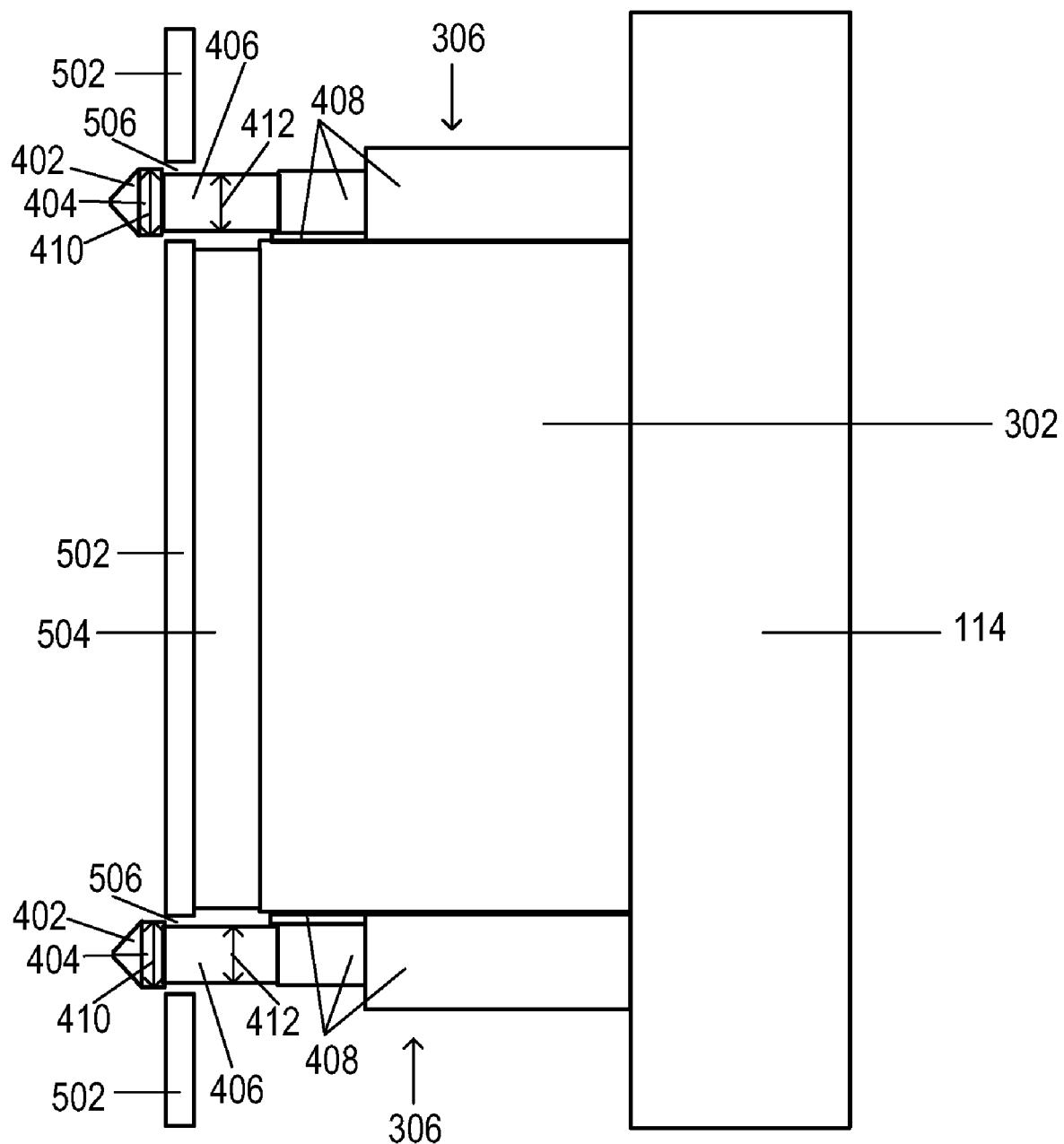
FIG. 8 is an enlarged side view of the portion of the server and the computer server chassis in a connected position.

FIG. 8 shows the connecting module 302 fully inserted. The second diameter 412 of each guidepin 306 is smaller than the diameter of the apertures 506. Therefore, as the release portion 406 enters the aperture 506, the connecting module 302 and the connector 504 come into contact with each other. In the fully inserted position, the connecting module 302 and the connector 504 control the connection because the second diameter 412 of the release portion 406 does not create a tight fit within the apertures 506 (i.e. disengages from the apertures so no contact is made between the release portion and the apertures). The release portion 406 prevents binding between the connectors and the guidepins 306 by allowing the connecting module and the connector to control the connection. If the guidepins 306 and the connectors are used to control the alignment at the same time, the connection may not properly form because the connectors may bind against each other and the guidepins. Also, binding between the connector 504 and the connecting module 302 may result in damage to the electrical pins inside the connector and the connecting module.

Therefore, as the guidepins 306 are inserted into the apertures 506 proper alignment is created between the connecting module 302 and the connector 504. The pre-alignment portion 402, followed by the alignment portion 404, and finally the release portion 406 enter the apertures 506 to create the proper alignment between the connecting module 302 of the server 114 and the connector 504 of the mounting plate 502. The release portion 406 allows the connecting module 302 and the connector 504 to guide the end of the connection, thereby completing the proper connection between the server 114 and the computer server chassis 100, without binding or damaging the connectors.

Figure 9:
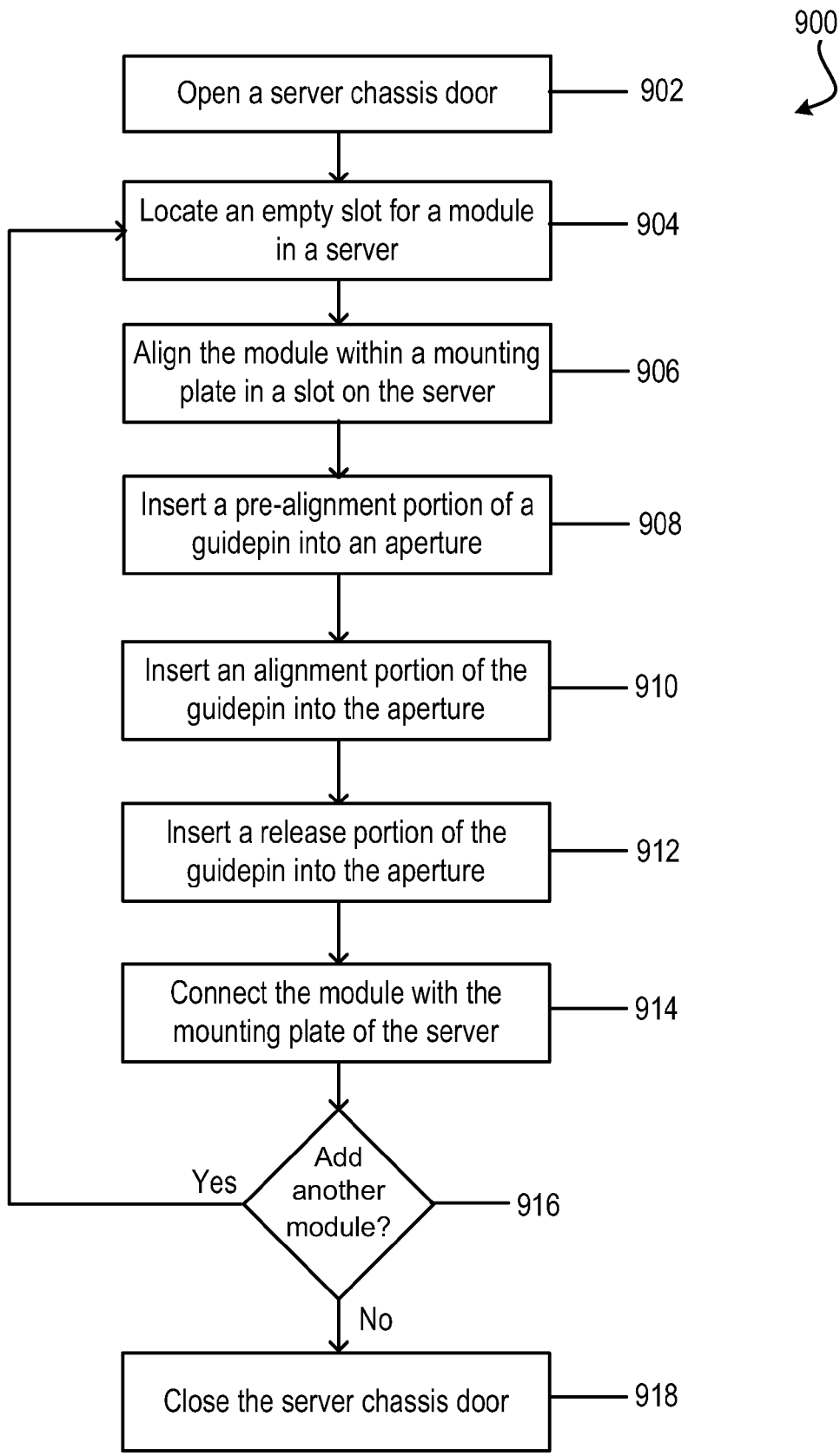
FIG. 9 is a flow chart of a method for connecting a server to a chassis.

FIG. 9 shows a flow chart of a method 900 for connecting a server in the computer server chassis. At block 902, a door on a computer server chassis rack is opened to gain access to the computer server chassis inside the computer server chassis rack. An individual locates an empty slot for a server in a computer server chassis at block 904. The individual may also first remove a damaged server from the computer server chassis to create the empty slot so that a replacement server may be inserted into the computer server chassis. At block 906, the individual aligns the server with a mounting plate in the empty slot of the computer server chassis. As the server is being connected with the mounting plate, a pre-alignment portion of a guidepin is inserted into an aperture on the mounting plate at block 908. Inserting the pre-alignment portion into the aperture provides gross alignment between the server and the mounting plate. At block 910, an alignment portion of the guidepin is inserted into the aperture of the mounting plate. The alignment portion provides high precision alignment between the server and the mounting plate by having a tight fit with the aperture of the mounting plate. A release portion of the guidepin is inserted into the aperture at block 912. At block 914 the server and the mounting plate are connected. The individual inserting the server into the computer server chassis decides whether to add another server to the computer server chassis at block 916. If the individual decides to insert another server, then an empty slot for the server is located in the computer server chassis at block 904 and the steps repeat as mentioned above. If the individual decides not to insert another server, then the computer server chassis rack door is closed at block 918.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An alignment guidepin for a server in a computer server chassis, the alignment guidepin comprising:
   a pre-alignment portion to provide gross alignment for a connection between a connecting module of the server and a connector of the computer server chassis;
   an alignment portion connected to the pre-alignment portion, the alignment portion having a first diameter that creates a high precision alignment for the connection between the connecting module and the connector based on the connecting module of the server having a plurality of electrical pins adapted to create a high bandwidth connection with the connector and the connecting module having a small amount of gatherability based on the plurality of electrical pins having a specific size and a specific distance between each of the plurality of electrical pins;
   a release portion connected to the alignment portion, the release portion having a second diameter different than the first diameter that induces the connecting module and the connector to guide the connection; and
   a mounting portion connected to the release portion, the mounting portion in physical communication with both the connecting module and the server.

2. The alignment guidepin of claim 1 wherein the first diameter is greater than the second diameter.

3. The alignment guidepin of claim 1 wherein the connection is a blind-mate connection.

4. The alignment guidepin of claim 1 wherein the connector includes one or more apertures.

5. The alignment guidepin of claim 4 wherein the alignment portion is configured to fully engage an inside of the apertures.

6. The alignment guidepin of claim 4 wherein the release portion is configured to disengage from the inside of the apertures.

7. The alignment guidepin of claim 1 wherein the connector also has the small amount of gatherability.

8. A method for connecting a sewer to a computer sewer chassis with an alignment guidepin, the method comprising:
   inserting a pre-alignment portion of the guidepin into an aperture of the computer server chassis for a gross alignment between the server and the computer server chassis;
   inserting an alignment portion of the guidepin with a first diameter into the aperture of the computer server chassis for a high precision alignment between the server and the computer sewer chassis;
   inserting a release portion of the guidepin with a second diameter into the aperture of the computer sewer chassis for allowing the server and the computer sewer chassis to guide a connection, the second diameter being different than the first diameter; and
   interconnecting the sewer and the computer server chassis with the high precision alignment based on a connecting module of the sewer having a plurality of electrical pins adapted to create a high bandwidth connection with a connector of the computer server chassis and the connecting module having a small amount of gatherability based on the plurality of electrical pins having a specific size and a specific distance between each of the plurality of electrical pins, and further in response to a mounting portion placing the guidepin in physical communication with both the connecting module and the server.

9. The method of claim 8 wherein the second diameter is smaller than the first diameter.

10. The method of claim 8 wherein the server and the computer server chassis have the small amount of gatherability.

11. The method of claim 10 wherein the alignment portion fully engages an inside of the apertures.

12. The method of claim 11 wherein the release portion disengages the guidepin from the inside of the apertures.

13. The method of claim 8 wherein the connection is a blind-mate connection.

14. The method of claim 8 wherein the server is a blade server.

15. A computer server chassis system comprising:
   a connecting module connected to a server, the connecting module including:
      a plurality of electrical pins, wherein the plurality of electrical pins are adapted to create a high bandwidth connection with a connector of a chassis;
      wherein the connecting module has a small amount of gatherability based on the plurality of electrical pins having a specific size and a specific distance between each of the plurality of electrical pins;
   a plurality of apertures connected to the connector; and
   a plurality of guidepins connected to the connecting module, the guidepins comprising:
      a pre-alignment portion to provide gross alignment for a connection between the connecting module and the connector;
      an alignment portion connected to the pre-alignment portion, the alignment portion having a first diameter to allow a high precision alignment for the connection between the connecting module and the connector;
      a release portion connected to the alignment portion, the release portion having a second diameter different than the first diameter to allow the connecting module and the connector to guide the connection; and
      a mounting portion connected to the release portion, the mounting portion in physical communication with both the connecting module and the server.

16. The computer server chassis system of claim 15 wherein the second diameter is smaller than the first diameter.

17. The computer server chassis system of claim 15 wherein the connection is a blind-mate connection.

18. The computer server chassis system of claim 15 wherein the alignment portion is configured to fully engage with an inside of the apertures.

19. The computer server chassis system of claim 15 wherein the release portion is configured to disengage the guidepins from the inside of the apertures.

20. The computer server chassis system of claim 15 wherein the connector also has the small amount of gatherability.

* * * * *